United States Patent [19]
Corby, Jr.

[11] Patent Number: 5,283,522
[45] Date of Patent: Feb. 1, 1994

[54] METHOD FOR MEASURING WEAK LOCAL MAGNETIC SIGNALS IN THE PRESENCE OF MAGNETIC NOISE FIELDS

[75] Inventor: Nelson R. Corby, Jr., Scotia, N.Y.

[73] Assignee: General Electric Company, Schenectady, N.Y.

[21] Appl. No.: 944,597

[22] Filed: Sep. 14, 1992

[51] Int. Cl.[5] .............................................. G01R 33/02
[52] U.S. Cl. ..................................... 324/244; 324/260
[58] Field of Search ..................... 324/244, 260, 225

[56] References Cited

U.S. PATENT DOCUMENTS 2,891,216  6/1959  Linder .................................. 324/244

Primary Examiner—Walter E. Snow
Attorney, Agent, or Firm—Paul R. Webb, II

[57] ABSTRACT

A method for measuring a local magnetic signal by estimating and eliminating the effects of one or more remote magnetic noise sources is provided. The method relies on "tagging" the undesired noise component of the local measurement in such a way as to allow separation of the noise component from the total measurement. The method makes use of the measurement apparatus already in place and does not require additional sensing channels.

2 Claims, 2 Drawing Sheets

METHOD FOR MEASURING WEAK LOCAL MAGNETIC SIGNALS IN THE PRESENCE OF MAGNETIC NOISE FIELDS

BACKGROUND OF THE INVENTION

There is often a need to measure the weak local magnetic field generated by a local source in the presence of ambient magnetic noise fields from remote, often strong sources. An example of such a weak magnetic field is a biomagnetic field generated from sources within living creatures. The local measurement is usually modeled as the sum of a signal term (from the local source) and a noise term (from the remote source). This is usually a good approximation since the two sources are normally independent. There are three general approaches that are employed. The first approach is to carry out the desired measurements within a magnetically shielded room or enclosure, thus minimizing or eliminating the effects of the ambient noise field. A second method uses a priori knowledge or estimates of the spatial variation of the noise field to design sensors that largely reject the undesired signal. A third method forms a "real-time" estimate of the noise field at the measurement site and eliminates the effects of the noise field by "subtracting" out the noise component "passively" (electronically subtract the estimated noise signal from the sensor signal) or "actively" (by generating a field in the vicinity of the sensor site to oppose the local value of the noise field). In either case, it is hoped that the sensor output contains none of the remote noise field.

When it is desirable to be able to perform measurements without the use of a shielded room, then elements of method two and three must be used to reject and/or cancel the effects of the noise sources. The current practice is to measure the noise field (and possibly the field gradients) at a location that is a bit farther away from the measurement site (thus minimizing the signal component contribution), but not too near to the remote noise source. Based on these measurements and an a priori model of the noise field behavior, an estimate of the noise field at the measurement site is calculated. Very often, the estimate of the noise field at the measurement site is poor due to the typically high spatial nonuniformity of the noise field. In many applications such as measurements of the magnetic fields from bioelectric sources, the ambient noise levels are $10^7$–$10^8$ times stronger than that signal. Thus, any extrapolations must be extremely precise.

What is needed therefore is a method to directly estimate the noise field component at the sensor site. Thus no extrapolation would be needed to estimate the noise field at the measurement site from a more remote noise measuring site.

SUMMARY OF THE INVENTION

The present invention is a method for measuring a weak local magnetic field by estimating the noise component of a total magnetic field measurement and eliminating the noise from the total measurement. Thus is done by tagging the noise component so that it can be filtered out or separated from the total measurement. The method of the present invention temporally modulates the noise and extracts the desired component by filtering it. Several methods for periodically attenuating the noise are disclosed including oscillating a coil in a gradiometer and utilizing time-varying superconductive effects.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1:
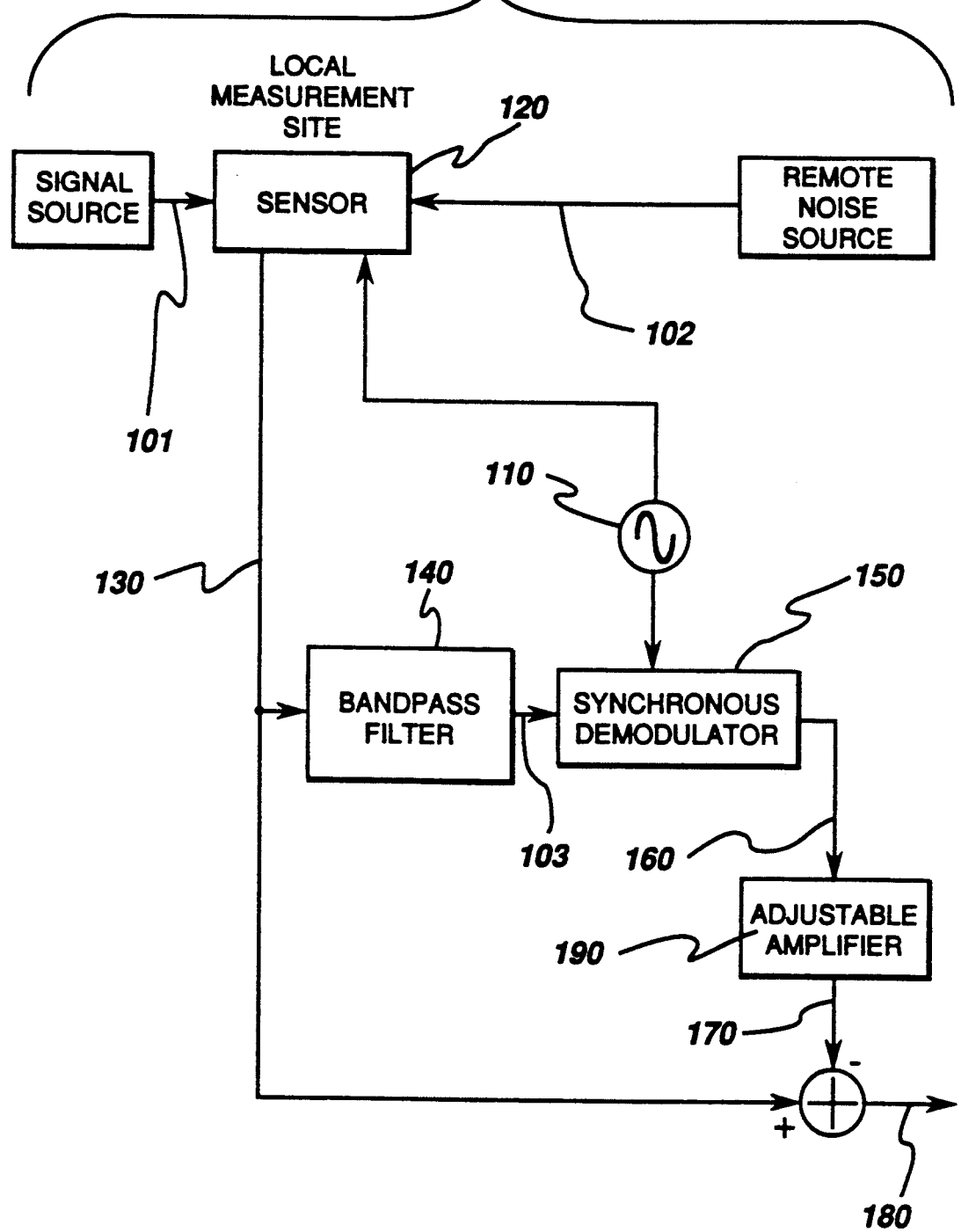
FIG. 1 is a block diagram of a system for measuring a weak local magnetic signal according to the present invention.

The present invention is a method and system for measuring a weak local magnetic signal by temporally tagging and subsequently filtering a noise component of the total signal measured. This is crucial when it is desired to measure the weak biomagnetic fields which emanate from the human brain, for instance. FIG. 1 is a functional block diagram which shows how this may be done. The present inventive method makes use of the principles of amplitude modulation (AM). Reference oscillator 110 is connected to sensor 120 which produces a first signal 130 which is the sum (ideally) of the desired weak local magnetic signal 101 and a modulated noise signal or component 102 from a remote noise source. Signal 130 is transmitted to bandpass filter 140 whose center frequency is the same as the frequency at which noise signal 102 is modulated. The resultant second signal 103 is then passed to synchronous demodulator 150. The modulation and demodulation can be carried out with simple multiplier circuitry. A demodulated signal 160 from demodulator 150 is amplified by a gain amplifier 190. The resultant third signal 170 is then subtracted from first signal 130 resulting in signal 180 which is equivalent to the desired weak local magnetic signal 101. If the estimate of the noise signal 170 is formed continuously and if the amplifier gain is adjustable, a time varying interference source can be eliminated. The rate at which the noise source can vary is determined by how often the noise estimate is adjusted.

Figure 2:
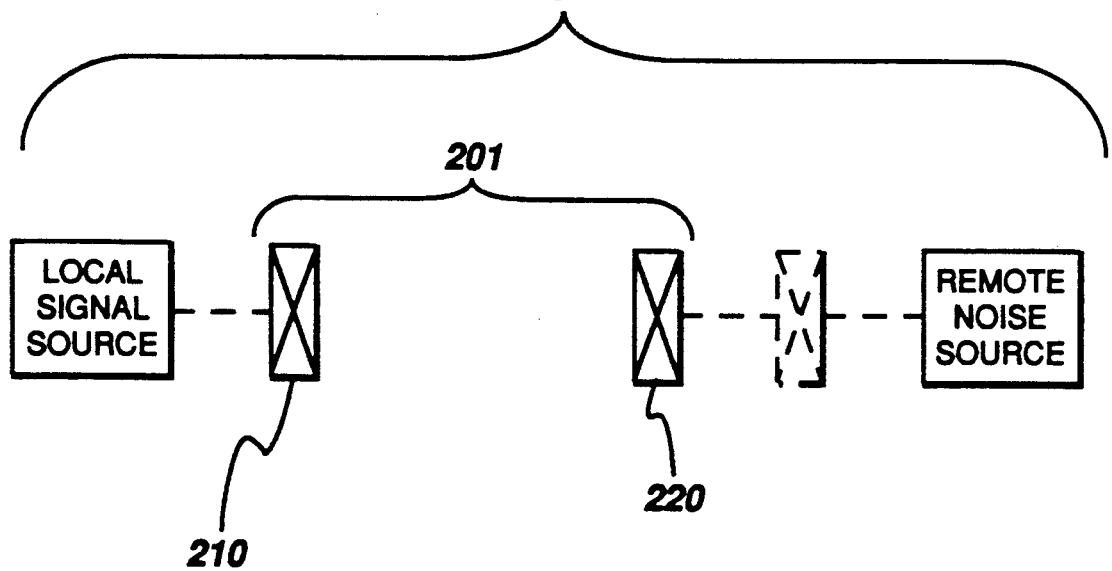
FIG. 2 is a gradiometer coil in accordance with the present invention.

Periodic attenuation of the remote noise source, which is shown being done in FIG. 1 with modulator 110, is illustrated in a biomagnetic measurement system in FIG. 2. FIG. 2 shows gradiometer 201 being used to attenuate the noise signal. The position of coil 220 (farthest from the signal source) is oscillated relative to the fixed base coil 210 in a sinusoidal fashion at a frequency that is 5–10 times higher than the highest signal frequency of interest. The resultant spectrum, centered at the modulation frequency, is the scaled sum of the signal spectrum and the noise spectrum as shown in equation (1) below:

$$S_{TOT} = k1 \times K \times S_{signal} + k2 \times K \times S_{noise} \qquad (1)$$

In the above expression, K is a modulation constant. Ideally, to get an uncontaminated noise estimate, k1 should equal zero and k2 should be non-zero. Due to the way in which a gradiometer operates, k1 can be made small but not zero. What is important is to make the ratio of k2/k1 as large as possible.

For a typical case, in a first order gradiometer where the signal to first coil distance =2cm, the coil to coil separation =9cm, and the distance to remote noise source =1000 cm, if the coil farthest away from the signal is moved back and forth with an amplitude of 0.5 cm peak-to-peak, $k1$ is 0.00375 while $k2$ is 0.0634. Thus, the noise-to-signal ratio is 16.8:1. The $k2/k1$ ratio can be made quite large by adjusting the coil geometry and the peak-to-peak movement amplitude. The total detected signal power ratio is found by multiplying the $k1/k2$ gain times S(noise)/S(signal). This ratio can be $10^6$ to $10^9$.

It would be desirable to use time-varying superconductive effects to modulate the offending noise signal. This would not require any moving parts. Candidates include modulating other coil characteristics such as area, number of turns or angular orientation and creating a time varying magnetic shield around the far coil. The latter may be possible with a superconducting shell that is periodically heated above its critical temperature.

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A method for measuring a local magnetic signal in the presence of a magnetic noise field, comprising the steps of
    sensing said local magnetic signal and a noise component from said magnetic noise field;
    modulating said noise component at a first frequency;
    producing a first signal from said local magnetic signal and said modulated noise component;
    bandpass filtering said first signal at said first frequency to produce a second signal;
    demodulating and amplifying said second signal to produce a third signal; and
    subtracting said third signal from said first signal to produce said local magnetic signal.

2. The method of claim 1 wherein said sensing step includes using a gradiometer having a first coil and a second coil, said second coil opposite said first coil and farther from said local magnetic signal and wherein said modulating step comprises oscillating the position of said second coil in a sinusoidal fashion at a high frequency.

* * * * *